United States Patent
Nishijima et al.

(10) Patent No.: US 11,162,003 B2
(45) Date of Patent: Nov. 2, 2021

(54) ADHESIVE COMPOSITION, SEALING SHEET, AND SEALED BODY

(71) Applicant: LINTEC CORPORATION, Tokyo (JP)

(72) Inventors: Kenta Nishijima, Tokyo (JP); Tatsuki Hasegawa, Tokyo (JP)

(73) Assignee: LINTEC CORPORATION, Tokyo (JP)

( * ) Notice: Subject to any disclaimer, the term of this patent is extended or adjusted under 35 U.S.C. 154(b) by 0 days.

(21) Appl. No.: 15/778,746

(22) PCT Filed: Nov. 24, 2016

(86) PCT No.: PCT/JP2016/084833
§ 371 (c)(1),
(2) Date: May 24, 2018

(87) PCT Pub. No.: WO2017/094591
PCT Pub. Date: Jun. 8, 2017

(65) Prior Publication Data
US 2018/0334594 A1    Nov. 22, 2018

(30) Foreign Application Priority Data
Dec. 1, 2015  (JP) .............................. JP2015-235058

(51) Int. Cl.
| | | |
|---|---|---|
| C09J 7/35 | (2018.01) | |
| C09J 7/40 | (2018.01) | |
| H01L 31/048 | (2014.01) | |
| H01L 51/52 | (2006.01) | |
| C09J 7/20 | (2018.01) | |
| C09J 151/06 | (2006.01) | |
| H05B 33/04 | (2006.01) | |
| C09J 163/00 | (2006.01) | |
| C09J 7/30 | (2018.01) | |
| H01L 51/50 | (2006.01) | |
| C09J 11/06 | (2006.01) | |
| C09J 7/10 | (2018.01) | |

(52) U.S. Cl.
CPC .  *C09J 7/20* (2018.01); *C09J 7/10* (2018.01); *C09J 7/30* (2018.01); *C09J 7/35* (2018.01); *C09J 7/40* (2018.01); *C09J 11/06* (2013.01); *C09J 151/06* (2013.01); *C09J 163/00* (2013.01); *H01L 31/0481* (2013.01); *H01L 51/50* (2013.01); *H01L 51/5253* (2013.01); *H05B 33/04* (2013.01); *C09J 2203/318* (2013.01); *C09J 2203/326* (2013.01); *C09J 2423/00* (2013.01); *C09J 2463/00* (2013.01)

(58) Field of Classification Search
CPC .. C09J 2423/00; C09J 2463/00; C08K 5/3445
See application file for complete search history.

(56) References Cited

U.S. PATENT DOCUMENTS

| | | | |
|---|---|---|---|
| 2009/0026934 A1* | 1/2009 | Fujita | ..................... C09J 123/20 |
| | | | 313/504 |
| 2014/0291655 A1 | 10/2014 | Suzuki et al. | |

FOREIGN PATENT DOCUMENTS

| | | |
|---|---|---|
| EP | 2502962 A1 | 9/2012 |
| EP | 3 196 266 A1 | 7/2017 |
| JP | 2008-163344 A | 7/2008 |
| JP | 2012-106421 A | 6/2012 |
| JP | 2013-226757 A | 11/2013 |
| JP | 2015-59198 A | 3/2015 |
| JP | 2015-59200 A | 3/2015 |
| JP | 2015059200 A * | 3/2015 |
| JP | 2015-137333 A | 7/2015 |
| WO | WO 2011/062167 A1 | 5/2011 |
| WO | WO 2013/147156 A1 | 10/2013 |
| WO | WO-2016047289 A1 * | 3/2016 ............... B32B 7/12 |

OTHER PUBLICATIONS

Machine translation JP 2015059200A. (Year: 2015).*
Machine translation WO 2016/047289 (Year: 2016).*
International Search Report, issued in PCT/JP2016/084833, PCT/ISA/210, dated Dec. 27, 2016.
Extended European Search Report dated Jun. 27, 2019, in European Patent Application No. 16870528.3.

* cited by examiner

*Primary Examiner* — Alexandre F Ferre
(74) *Attorney, Agent, or Firm* — Birch, Stewart, Kolasch & Birch, LLP

(57) ABSTRACT

Disclosed is an adhesive composition having components (A), (B) and (C): Component (A): modified polyolefin-based resin, Component (B): polyfunctional epoxy compound, and Component (C): imidazole-based curing catalyst. Also provided is a sealing sheet composed of two release films and an adhesive layer sandwiched between the release films, wherein the adhesive layer is made by using the adhesive composition and has a thermosetting property. Also disclosed is a sealed body obtained by sealing a seal subject with the sealing sheet. The adhesive composition has excellent adhesion strength, a sealing sheet made by using the adhesive composition and having an adhesive layer is excellent in sealing performance, and a sealed body obtained by sealing a seal subject with the sealing sheet.

12 Claims, No Drawings

ADHESIVE COMPOSITION, SEALING SHEET, AND SEALED BODY

TECHNICAL FIELD

The present invention relates to an adhesive composition excellent in adhesion strength, a sealing sheet made by using the adhesive composition and having an adhesive layer excellent in sealing performance, and a sealed body obtained by sealing a seal subject with the sealing sheet.

BACKGROUND ART

In recent years, organic EL elements have attracted attention as light emitting elements capable of high-luminance emission through low-voltage direct-current drive.

However, the organic EL elements have had a problem that light-emitting properties such as light emission luminance, light emission efficiency and light emission uniformity tend to deteriorate with time.

It is considered that the problem of the deteriorated light-emitting properties is caused by the fact that oxygen, water or the like penetrates into an organic EL element to deteriorate an electrode and an organic layer.

As a countermeasure therefor, several methods using sealants have been proposed. For example, Patent Document 1 describes a sheet-like sealant which contains an olefin polymer having a melting enthalpy and a weight average molecular weight within a specific range and a hydrocarbon-based synthetic oil having a kinematic viscosity at 40° C. within a specific range.

CITATION LIST

Patent Literature

Patent Literature 1: JP-A-2015-137333

SUMMARY OF INVENTION

Technical Problem

The sheet-like sealant described in Patent Document 1 has a characteristic that it can be peeled off if needed. However, there has been a tendency that this sheet-like sealant is poor in adhesion strength.

Seal subjects such as an organic EL element are often used under severe conditions such as an outdoor side and a car inside space. Thus, a sealant which has excellent adhesion performance even under such conditions and can sufficiently seal a seal subject, and an adhesive composition used as a forming material for such a sealant have been requested.

The present invention has been made in view of the above situation, and an object of the present invention is to provide an adhesive composition excellent in adhesion strength and also in water barrier property, a sealing sheet made by using the adhesive composition and having an adhesive layer excellent in sealing performance, and a sealed body obtained by sealing a seal subject with the sealing sheet.

Solution to Problem

As a result of intensive studies in order to solve the above problems, the present inventors have found that an adhesive composition containing a modified polyolefin-based resin, an epoxy compound and an imidazole-based curing catalyst is excellent in adhesion strength and water barrier property, and this finding has led to the completion of the invention.

Thus, one aspect of the invention provides adhesive compositions of (1) to (6), sealing sheets of (7) to (9), and sealed bodies of (10) and (11) described below.

(1) An adhesive composition containing the following components (A), (B) and (C):
  Component (A): modified polyolefin-based resin,
  Component (B): polyfunctional epoxy compound, and
  Component (C): imidazole-based curing catalyst.
(2) The adhesive composition according to (1), wherein the component (A) is an acid-modified polyolefin-based resin.
(3) The adhesive composition according to (1) or (2), wherein a content of the component (A) is 45 to 95 mass % based on a total solid content of the adhesive composition.
(4) The adhesive composition according to (1), wherein a content of the component (B) is 5 to 110 parts by mass based on 100 parts by mass of the component (A).
(5) The adhesive composition according to (1), wherein a content of the component (C) is 0.1 to 10 parts by mass based on 100 parts by mass of the component (B).
(6) The adhesive composition according to (1), further containing the following component (D):
  Component (D): silane coupling agent.
(7) A sealing sheet composed of two release films and an adhesive layer sandwiched between the release films, wherein the adhesive layer is made by using the adhesive composition according to (1) and has thermosetting property.
(8) A sealing sheet composed of a release film, a gas barrier film, and an adhesive layer sandwiched between the release film and the gas barrier film, wherein the adhesive layer is made by using the adhesive composition according to (1) and has thermosetting property.
(9) The sealing sheet according to (8), wherein the gas barrier film is a metal foil, a resin film or a thin film glass.
(10) A sealed body obtained by sealing a seal subject with the sealing sheet according to (7).
(11) The sealed body according to (10), wherein the seal subject is an organic EL element, an organic EL display element, a liquid crystal display element or a solar cell element.

Advantageous Effects of Invention

One aspect of the invention provides an adhesive composition excellent in adhesion strength, a sealing sheet made by using the adhesive composition and having an adhesive layer excellent in sealing performance, and a sealed body obtained by sealing a seal subject with the sealing sheet.

DESCRIPTION OF EMBODIMENTS

Hereinafter, the embodiments of the present invention are classified into 1) adhesive composition, 2) sealing sheet and 3) sealed body, and described in detail.

1) Adhesive Composition

The adhesive composition according to one embodiment of the invention contains the following components (A), (B) and (C):
  Component (A): modified polyolefin-based resin,
  Component (B): polyfunctional epoxy compound, and
  Component (C): imidazole-based curing catalyst.
Component (A): Modified Polyolefin-Based Resin The adhesive composition according to one embodiment of the invention contains a modified polyolefin-based resin as the component (A).

When the adhesive composition according to one embodiment of the invention contains the modified polyolefin-based resin, it is excellent in adhesion strength. In addition, when an adhesive composition containing the modified polyolefin-based resin is used, an adhesive layer having a thickness described below can be efficiently formed.

Component (A): Modified Polyolefin-Based Resin

The adhesive composition according to one embodiment of the invention contains a modified polyolefin-based resin as the component (A).

When the adhesive composition according to one embodiment of the invention contains the modified polyolefin-based resin, it is excellent in adhesion strength. In addition, when an adhesive composition containing the modified polyolefin-based resin is used, an adhesive layer having a thickness described below can be efficiently formed.

The modified polyolefin-based resin is a polyolefin resin into which a functional group is introduced and which is obtained by modifying a polyolefin resin as a precursor by using a modifier.

The term polyolefin resin refers to a polymer containing a repeating unit derived from an olefin-based monomer. The polyolefin resin may be a polymer composed only of the repeating unit derived from an olefin-based monomer or may be a polymer composed of the repeating unit derived from the olefin-based monomer and a repeating unit derived from a monomer copolymerizable with an olefin-based monomer.

The olefin-based monomer is preferably α-olefin having 2 to 8 carbon atoms, more preferably ethylene, propylene, 1-butene, isobutylene or 1-hexene, and even more preferably ethylene or propylene.

Examples of the monomer copolymerizable with the olefin-based monomer include vinyl acetate, (meth) acrylate ester, styrene and the like.

Examples of the polyolefin resin include an ultralow-density polyethylene (VLDPE), a low-density polyethylene (LDPE), a medium-density polyethylene (MDPE), a high-density polyethylene (HDPE), a linear low-density polyethylene, a polypropylene (PP), an ethylene-propylene copolymer, an olefin-based elastomer (TPO), an ethylene-vinyl acetate copolymer (EVA), an ethylene-(meth)acrylic acid copolymer and an ethylene-(meth)acrylate copolymer ester, and the like.

The weight average molecular weight (Mw) of the polyolefin resin is 10,000 to 2,000,000, and preferably 20,000 to 1,500,000.

The modifier used for modifying the polyolefin resin is a compound having a functional group i.e. a group contributing to a crosslinking reaction described later in its molecule.

Examples of the functional group include a carboxyl group, a carboxylic anhydride group, a carboxylate ester group, a hydroxyl group, an epoxy group, an amide group, an ammonium group, a nitrile group, an amino group, an imide group, an isocyanate group, an acetyl group, a thiol group, an ether group, a thioether group, a sulfone group, a phosphonic group, a nitro group, an urethane group, a halogen atom and the like. Above all, the carboxyl group, the carboxylic anhydride group, the carboxylate ester group, the hydroxyl group, the ammonium group, the amino group, the imide group and the isocyanate group are preferred, the carboxylic anhydride group and an alkoxysilyl group are more preferred, and the carboxylic anhydride group is particularly preferred.

The compound having functional groups may have two or more functional groups in its molecule.

Examples of the modified polyolefin-based resin include an acid-modified polyolefin-based resin and a silane-modified polyolefin-based resin, and the acid-modified polyolefin-based resin is preferred from the viewpoint of obtaining more excellent effects of one embodiment of the invention.

The term acid-modified polyolefin-based resin refers to a resin obtained by graft-modifying a polyolefin resin with an acid. It is exemplified by a resin obtained by reacting a polyolefin resin with an unsaturated carboxylic acid and introducing a carboxyl group thereto (graft modification). Note that, herein, the term unsaturated carboxylic acid includes a concept of carboxylic anhydrides, and the term carboxyl group includes a concept of carboxylic anhydride groups.

Examples of the unsaturated carboxylic acid to be reacted with the polyolefin resin include maleic acid, fumaric acid, itaconic acid, citraconic acid, glutaconic acid, tetrahydrophthalic acid, aconitic acid, maleic anhydride, itaconic anhydride, glutaconic anhydride, citraconic anhydride, aconitic anhydride, norbornene dicarboxylic anhydride, tetrahydrophthalic anhydride, and the like.

They may be used either alone or in combination of two or more kinds. Above all, the maleic anhydride is preferred because an adhesive composition more excellent in adhesion strength can be easily obtained.

The amount of the unsaturated carboxylic acid to be reacted with the polyolefin resin is preferably 0.1 to 5 parts by mass, more preferably 0.2 to 3 parts by mass, and even more preferably 0.2 to 1.0 part by mass based on 100 parts by mass of the polyolefin resin. The adhesive composition containing the acid-modified polyolefin-based resin obtained in this way is more excellent in adhesive strength.

As the acid-modified polyolefin-based resin, a commercial product can also be used. Examples of the commercial product include ADMER (registered trademark) (manufactured by Mitsui Chemicals, Inc.), UNISTOLE (registered trademark) (manufactured by Mitsui Chemicals, Inc.), BondyRam (manufactured by Polyram Plastic Industries Ltd), Orevac (registered trademark) (manufactured by Arkema S.A.), MODIC (registered trademark) (manufactured by Mitsubishi Chemical Corporation), and the like.

Examples of the polyolefin resin which is a precursor of the silane-modified polyolefin-based resin include the polyolefin resin described for exemplifying the polyolefin resin to be graft-modified with an acid.

The term silane-modified polyolefin-based resin refers to a resin obtained by graft-modifying a polyolefin resin with an unsaturated silane compound. The silane-modified polyolefin-based resin has a structure in which a polyolefin resin as a main chain is graft-copolymerized with an unsaturated silane compound as a side chain. Examples thereof include silane-modified polyethylene resins and silane-modified ethylene-vinyl acetate copolymers, and above all, the silane-modified polyethylene resins such as a silane-modified low-density polyethylene, a silane-modified ultralow-density polyethylene and a silane-modified linear low-density polyethylene are preferred.

As the unsaturated silane compound to be reacted with the polyolefin resin, a vinylsilane compound is preferred, and examples thereof include, for example, vinyltrimethoxysilane, vinyltriethoxysilane, vinyltripropoxysilane, vinyltriisopropoxysilane, vinyltributoxysilane, vinyltripentyloxysilane, vinyltriphenoxysilane, vinyltribenzyloxysilane, vinyltrimethylenedioxysilane, vinyltriethylenedioxysilane, vinylpropionyloxysilane, vinyltriacetoxysilane, vinyltricarboxysilane and the like. They may be used either alone or in combination of two or more kinds.

Note that, as a condition for graft-polymerizing the unsaturated silane compound with a polyolefin resin as a main chain, it is recommended to adopt a known ordinary method for graft polymerization.

The amount of the unsaturated silane compound to be reacted with the polyolefin resin is preferably 0.1 to 10 parts by mass, particularly preferably 0.3 to 7 parts by mass, and preferably 0.5 to 5 parts by mass based on 100 parts by mass of the polyolefin resin. When the amount of the unsaturated silane compound to be reacted is within the above range, the resulting adhesive composition containing the silane-modified polyolefin-based resin is more excellent in adhesion strength.

As the silane-modified polyolefin-based resin, a commercial product can also be used. Examples of the commercial product include, for example, LINKRON (registered trademark) (manufactured by Mitsubishi Chemical Corporation), and the like. Above all, a low-density polyethylene-based LINKRON, a linear low-density polyethylene-based LINKRON, an ultralow-density polyethylene-based LINKRON, and an ethylene-vinyl acetate copolymer-based LINKRON can be preferably used.

The modified polyolefin-based resin may be used either alone or in combination of two or more kinds.

The content of the modified polyolefin-based resin is preferably 45 to 95 mass %, and more preferably 50 to 90 mass %, based on the total solid content of the adhesive composition according to one embodiment of the invention. The adhesive composition containing the modified polyolefin-based resin in an amount within this range is more excellent in adhesion strength.

Component (B): Polyfunctional Epoxy Compound

The adhesive composition according to one embodiment of the invention contains a polyfunctional epoxy compound as the component (B).

Since the adhesive composition according to one embodiment of the invention contains a polyfunctional epoxy compound, the cured product thereof is excellent in water vapor barrier property.

The term polyfunctional epoxy compound refers to a compound having at least two epoxy groups in its molecule.

Examples of the epoxy compound having two or more epoxy groups include bisphenol A diglycidyl ether, bisphenol F diglycidyl ether, bisphenol S diglycidyl ether, brominated bisphenol A diglycidyl ether, brominated bisphenol F diglycidyl ether, brominated bisphenol S diglycidyl ether, novolak-type epoxy resin (e.g. phenol/novolak-type epoxy resin, cresol/novolak-type epoxy resin, brominated phenol/novolak-type epoxy resin), hydrogenated bisphenol A diglycidyl ether, hydrogenated bisphenol F diglycidyl ether, hydrogenated bisphenol S diglycidyl ether, pentaerythritol polyglycidyl ether, 1,6-hexanediol diglycidyl ether, diglycidyl hexahydrophthalate, neopentylglycol diglycidyl ether, trimethylolpropane polyglycidyl ether, 2,2-bis(3-glycidyl-4-glycidyloxyphenyl) propane, dimethylol tricyclodecane diglycidyl ether, and the like.

These polyfunctional epoxy compounds may be used either alone or in combination of two or more kinds.

The content of the polyfunctional epoxy compound in the adhesive composition according to one embodiment of the invention is preferably 5 to 110 parts by mass, and more preferably 10 to 100 parts by mass based on 100 parts by mass of the component (A). The cured adhesive composition containing the polyfunctional epoxy compound in an amount within this range is more excellent in water vapor barrier property.

Component (C): Imidazole-Based Curing Catalyst

The adhesive composition according to one embodiment of the invention contains an imidazole-based curing catalyst as the component (C).

When the modified polyolefin-based resin and the imidazole-based curing catalyst are used in combination in the adhesive composition according to one embodiment of the invention, the cured product shows excellent adhesiveness even at high temperature.

Examples of the imidazole-based curing catalyst include 2-methylimidazole, 2-phenylimidazole, 2-undecylimidazole, 2-heptadecylimidazole, 2-ethyl-4-methylimidazole, 2-phenyl-4-methylimidazole, 2-phenyl-4-methyl-5-hydroxymethylimidazole, 2-phenyl-4,5-dihydroxymethylimidazole, and the like.

These imidazole-based curing catalysts may be used either alone or in combination of two or more kinds.

The content of the imidazole-based curing catalyst in the adhesive composition according to one embodiment of the invention is preferably 0.1 to 10 parts by mass, and more preferably 0.5 to 5 parts by mass based on 100 parts by mass of the component (B). The cured adhesive composition containing the imidazole-based curing catalyst in an amount within this range shows excellent adhesiveness even at high temperature.

The adhesive composition according to one embodiment of the invention may contain a silane coupling agent as the component (D).

When the adhesive composition according to one embodiment of the invention contains a silane coupling agent, it is more excellent in adhesion strength under an environment at normal temperature and high temperature.

As the silane coupling agent, an organosilicon compound having at least one alkoxysilyl group in its molecule is preferred.

Examples of the silane coupling agent include a polymerizable unsaturated group-containing silicon compound such as vinyltrimethoxysilane, vinyltriethoxysilane and methacryloxypropyltrimethoxysilane; a silicon compound containing an epoxy structure, such as 3-glycidoxypropyltrimethoxysilane, 2-(3,4-epoxycyclohexyl) ethyltrimethoxysilane, 3-glycidoxypropyltrimethoxysilane and 8-glycidoxyoctyltrimethoxysilane; a silicon compound containing an amino group, such as 3-am inopropyltrimethoxysilane, N-(2-aminoethyl)-3-aminopropyltrimethoxysilane and N-(2-aminoethyl)-3-aminopropylmethyldimethoxysilane; 3-chloropropyltrimethoxysilane; 3-isocyanatopropyltriethoxysilane; and the like.

These silane coupling agents may be used either alone or in combination of two or more kinds.

When the adhesive composition according to one embodiment of the invention contains a silane coupling agent, the content of the silane coupling agent is preferably 0.01 to 5.0 parts by mass, and more preferably 0.05 to 1.0 part by mass based on 100 parts by mass of the component (A).

The adhesive composition according to one embodiment of the invention may contain a solvent.

Examples of the solvent include an aromatic hydrocarbon-based solvent such as benzene and toluene; an ester-based solvent such as ethyl acetate and butyl acetate; a ketone-based solvent such as acetone, methylethylketone and methylisobutylketone; an aliphatic hydrocarbon-based solvent such as n-pentane, n-hexane and n-heptane; an alicyclic hydrocarbon-based solvent such as cyclopentane, cyclohexane and methylcyclohexane; and the like.

These solvents may be used either alone or in combination of two or more kinds.

The content of the solvent can be appropriately determined in consideration of coating performance and the like.

The adhesive composition according to one embodiment of the invention may contain other components as long as the effects of the present invention are not impaired.

Examples of the other components include additives such as UV absorber, antistatic agent, light stabilizer, antioxidant, resin stabilizer, filler, pigment, extender and softener.

They may be used either alone or in combination of two or more kinds.

When the adhesive composition according to one embodiment of the invention contains these additives, the content thereof can be appropriately determined depending on the intended purpose.

The adhesive composition according to one embodiment of the invention can be prepared by appropriately mixing and stirring predetermined components in accordance with an ordinary method.

The adhesive composition according to one embodiment of the invention is excellent in adhesion strength. Hence, the adhesive composition according to one embodiment of the invention is suitably used for forming a sealant.

2) Sealing Sheet

The sealing sheet according to one embodiment of the invention is the following sealing sheet ($\alpha$) or sealing sheet ($\beta$).

Sealing sheet ($\alpha$): a sealing sheet composed of two release films and an adhesive layer sandwiched between these release films, characterized in that the adhesive layer is made by using the adhesive composition according to one embodiment of the invention and has thermosetting property.

Sealing sheet ($\beta$): a sealing sheet composed of a release film, a gas barrier film, and an adhesive layer sandwiched between the release film and the gas barrier film, characterized in that the adhesive layer is made by using the adhesive composition according to one embodiment of the invention and has thermosetting property.

Note that these sealing sheets are described in pre-use states, and when using the sealing sheet according to one embodiment of the invention, the release film is normally peeled off.

The release film constituting the sealing sheet ($\alpha$) functions as a support in the step of producing the sealing sheet ($\alpha$), and functions as a protective sheet for the adhesive layer until the sealing sheet ($\alpha$) is used.

As the release film, a conventionally-known film can be used. It can be exemplified by a film having a release layer prepared by providing release treatment on a substrate for a release film with a release agent.

Examples of the substrate for the release film include a paper substrate such as glassine paper, coated paper and woodfree paper; a laminated paper obtained by laminating a thermoplastic resin such as polyethylene on these paper substrates; a plastic film such as polyethylene terephthalate resin, polybutylene terephthalate resin, polyethylene naphthalate resin, polypropylene resin and polyethylene resin; and the like.

Examples of the release agent include a rubber-based elastomer such as silicone-based resin, olefin-based resin, isoprene-based resin and butadiene-based resin, a long-chain alkyl-based resin, an alkyd-based resin, a fluorine-based resin, and the like.

Although the two release films on the sealing sheet ($\alpha$) may be either identical to or different from each other, the two release films preferably have different peeling forces. When the two peeling films have different peeling forces, problems hardly occur during using the sealing sheet. That is, when the two release films are made to have different peeling forces, the first step of peeling the release film can be more efficiently carried out.

The adhesive layer of the sealing sheet ($\alpha$) normally has a thickness of 1 to 50 and preferably 5 to 25 $\mu$m.

An adhesive layer having a thickness within the above range is suitably used as a sealant.

The adhesive layer of the sealing sheet ($\alpha$) has thermosetting property. Thus, the adhesive layer of the sealing sheet ($\alpha$) is extremely excellent in adhesion strength after curing.

Conditions for thermally curing the adhesive layer are not particularly limited.

The heating temperature is normally 80 to 200° C., and preferably 90 to 150° C.

The heating time is normally 30 minutes to 12 hours, and preferably 1 to 6 hours.

The peel adhesion strength of the cured adhesive layer at 23° C. is normally 1 to 100 N/25 mm, preferably 10 to 50 N/25 mm, and the peel adhesion strength at 85° C. is normally 1 to 100 N/25 mm, and preferably 5 to 50 N/25 mm.

The peel adhesion strength was measured in accordance with the method described in Examples.

The water vapor permeability of the cured adhesive layer is normally 0.1 to 200 $g \cdot m^{-2} \cdot day^{-1}$, and preferably 1 to 150 $g \cdot m^2 \cdot day^{-1}$.

The method for producing the sealing sheet ($\alpha$) is not particularly limited. For example, a casting method can be used to produce the sealing sheet ($\alpha$).

When the sealing sheet ($\alpha$) is produced by a casting method, the adhesive composition according to one embodiment of the invention may be applied on the release-treated surface of the release film using a known method, the resulting coated film may be dried to produce an adhesive layer having the release film, and then the other one release film is laid on the adhesive layer to obtain the sealing sheet ($\alpha$).

Examples of the method for applying the adhesive composition include a spin coating method, a spray coating method, a bar coating method, a knife coating method, a roll coating method, a blade coating method, a die coating method, a gravure coating method and the like.

In an example of a drying condition for drying the coating film, it is dried e.g. at 80 to 150° C. for 30 seconds to 5 minutes.

The release film and the adhesive layer constituting the sealing sheet ($\beta$) are respectively exemplified by those similar to ones shown as the release film and the adhesive layer constituting the sealing sheet ($\alpha$).

The gas barrier film constituting the sealing sheet ($\beta$) is not particularly limited as long as it is a film having water barrier property.

The gas barrier film has a water vapor permeability of preferably 0.1 g/m²/day or lower, more preferably 0.05 g/m²/day or lower, and even more preferably 0.005 g/m²/day or lower under an environment at 40° C. and a relative humidity of 90% (hereinafter abbreviated as "90% RH").

When the gas barrier film has a water vapor permeability of 0.1 g/m²/day or lower under an environment at 40° C. and 90% RH, it is possible to effectively prevent a phenomenon that oxygen, water or the like penetrates the inside of the element such as an organic EL element formed on the transparent substrate, resulting in deterioration of an electrode and an organic layer.

The permeability of the gas barrier film for water vapor or the like can be measured using a known gas permeability measuring device.

Examples of the gas barrier film include a metal foil, a resin film, a thin-film glass, and the like. Above all, the resin film is preferred, and a gas barrier film having a substrate and a gas barrier layer is more preferred.

Examples of the resin component constituting the substrate include polyimide, polyamide, polyamideimide, polyphenylene ether, polyether ketone, polyetherether ketone, polyolefin, polyester, polycarbonate, polysulfone, polyethersulfone, polyphenylene sulfide, polyarylate, acrylic resin, cycloolefin-based polymer, aromatic polymer, polyurethane-based polymer, and the like.

The thickness of the substrate is not particularly limited, but is preferably 0.5 to 500 μm, more preferably 1 to 200 μm, and even more preferably 5 to 100 μm from the viewpoint of ease of handling.

The material or the like of the gas barrier layer is not particularly limited as long as it can provide a desired gas barrier property. Examples of the gas barrier layer include an inorganic film, a layer obtained by reforming a layer containing a polymer compound, and the like. Above all, as the barrier layer, a gas barrier layer composed of an inorganic film, and a gas barrier layer obtained by injecting ions into a layer containing a polymer compound are preferred, because a thin layer excellent in gas barrier property can be efficiently formed.

The inorganic film is not particularly limited, and exemplified by an inorganic vapor-deposited film.

The inorganic vapor-deposited film is exemplified by a vapor-deposited film of an inorganic compound and a metal.

Examples of raw materials for the vapor-deposited film of the inorganic compound include an inorganic oxide such as silicon oxide, aluminum oxide, magnesium oxide, zinc oxide, indium oxide and tin oxide; an inorganic nitride such as silicon nitride, aluminum nitride and titanium nitride; an inorganic carbide; an inorganic sulfide; an inorganic oxynitride such as silicon oxynitride; an inorganic oxycarbide; an inorganic nitrocarbide; an inorganic oxynitrocarbide, and the like.

Examples of raw materials for the vapor-deposited film of the metal include aluminum, magnesium, zinc, tin and the like.

For the gas barrier layer obtained by injecting ions into a layer containing a polymer compound (hereinafter referred to as "polymer layer" in some cases), examples of the polymer compound to be used include a silicon-containing polymer compound such as polyorganosiloxane and polysilazane-based compound, polyimide, polyamide, polyamideimide, polyphenylene ether, polyether ketone, polyetherether ketone, polyolefin, polyester, polycarbonate, polysulfone, polyethersulfone, polyphenylene sulfide, polyarylate, acrylic resin, cycloolefin-based polymer, aromatic polymer, and the like. These polymer compounds may be used either alone or in combination of two or more kinds.

Above all, the silicon-containing polymer compound is preferred, and the polysilazane-based compound is more preferred from the viewpoint of a capability of forming a gas barrier layer excellent in gas barrier property The polysilazane-based compound is a polymer compound having a repeating unit containing —Si—N— bond (silazane bond) in its molecule. Specifically, a compound having a repeating unit represented by formula (1) is preferred.

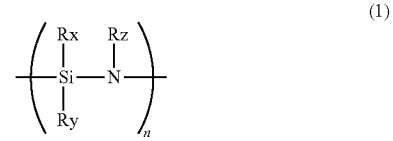

In addition, the number average molecular weight of the polysilazane-based compound to be used is not particularly limited, but is preferably 100 to 50,000.

In the above formula (1), n represents any natural number.

Each of Rx, Ry and Rz independently represents a hydrogen atom, an alkyl group without or with substituents, a cycloalkyl group without or with substituents, an alkenyl group without or with substituents, an aryl group without or with substituents, or a nonhydrolyzable group such as an alkylsilyl group. Above all, as Rx, Ry and Rz, a hydrogen atom, an alkyl group having 1 to 6 carbon atoms, or a phenyl group is preferred, and a hydrogen atom is particularly preferred. The polysilazane-based compound having a repeating unit represented by the above formula (1) may be any of an inorganic polysilazane in which all of Rx, Ry and Rz are hydrogen atoms, and an organic polysilazane in which at least one of Rx, Ry and Rz is not a hydrogen atom.

The polysilazane-based compounds may be used either alone or in combination of two or more kinds. In the present invention, a polysilazane-modified product can also be used as the polysilazane-based compound. Furthermore, in the present invention, a commercial product which is commercially available as a glass coating material or the like can also be used as is, as the polysilazane-based compound.

The polymer layer may contain not only the above-described polymer compounds but also other components unless the object of the present invention is impaired. Examples of other components include a curing agent, another polymer, an age resister, a light stabilizer, a flame retardant, and the like.

The content of the polymer compound in the polymer layer is preferably 50 mass % or more, and more preferably 70 mass % or more, because a gas barrier layer more excellent in gas barrier property can be obtained.

The thickness of the polymer layer is not particularly limited, but is preferably 50 to 300 nm, and more preferably 50 to 200 nm.

In the present invention, even if the thickness of the polymer layer is of nano-order, a sealing sheet having sufficient gas barrier property can be obtained.

The method for forming the polymer layer is exemplified by a method in which a layer-forming solution containing at least one polymer compound, optionally other components, a solvent and the like is applied using a known device such as a spin coater, a knife coater and a gravure coater, and the resulting coated film is moderately dried to form a polymer layer.

Examples of the reforming treatment of the polymer layer include ion injection treatment, plasma treatment, UV irradiation treatment, heat treatment, and the like.

The ion injection treatment is a method of reforming the polymer layer by injecting ions into the polymer layer, as described later.

The plasma treatment is a method of reforming the polymer layer by exposing the polymer layer into plasma.

For example, plasma treatment can be carried out in accordance with the method described in JP-A-2012-106421.

The UV irradiation treatment is a method of reforming the polymer layer by irradiating the polymer layer with ultraviolet ray. For example, ultraviolet reforming treatment can be carried out in accordance with the method described in JP-A-2013-226757.

Above all, the ion injection treatment is preferred because the surface of the polymer layer is not damaged, even its inside can be efficiently reformed and a gas barrier layer more excellent in gas barrier property can be formed.

Examples of the ions to be injected into the polymer layer include an ion of a rare gas such as argon, helium, neon, krypton and xenon; an ion of fluorocarbon, hydrogen, nitrogen, oxygen, carbon dioxide, chlorine, fluorine and sulfur; an ion of alkane-based gases such as methane and ethane; an ion of alkene-based gases such as ethylene and propylene; an ion of alkadiene-based gases such as pentadiene and butadiene; an ion of alkyne-based gases such as acetylene; an ion of aromatic hydrocarbon-based gases such as benzene and toluene; an ion of cycloalkane-based gases such as cyclopropane; an ion of cycloalkene-based gases such as cyclopentene; a metal ion; an ion of an organosilicon compound; and the like.

These ions may be used either alone or in combination of two or more kinds.

Above all, the ion of the rare gas such as argon, helium, neon, krypton and xenon are preferred because the ion can be more easily injected and a gas barrier layer specially excellent in gas barrier property can be obtained.

The method of injecting ions is not particularly limited. Examples thereof include a method of irradiating an ion (ion beam) accelerated by an electric field, a method of injecting an ion into plasma (ion of a plasma-generating gas), and the like. The latter method of injecting the plasma ion is preferred, because a gas barrier layer can be easily obtained. The plasma ion injection method can be carried out e.g. by a process in which plasma is generated under an atmosphere containing a plasma-generating gas, a negative high-voltage pulse is applied to a layer into which ions are to be injected, and thereby ions (cations) in the plasma are injected into the surface portion of the layer to which the ions are to be injected.

The method for producing the sealing sheet (β) is not particularly limited. For example, in the method for producing the sealing sheet (α) described above, the sealing sheet (β) can be produced by replacing one piece of the release films with the gas barrier film.

In addition, after producing the sealing sheet (α), the one release film may be peeled off, and the exposed adhesive layer may be bonded with the gas barrier film to produce the sealing sheet (β). In this case, when the sealing sheet (α) has two release films having different peeling forces, it is preferred to peel the release film having the smaller peeling force from the viewpoint of handling property.

3) Sealed Body

The sealed body according to one embodiment of the invention is obtained by sealing the seal subject with the sealing sheet according to one embodiment of the invention.

The sealed body according to one embodiment of the invention is exemplified by a sealed body which has a transparent substrate, an element (seal subject) formed on the transparent substrate and a sealant for sealing the element, wherein the sealant is an adhesive layer of the sealing sheet according to one embodiment of the invention.

The transparent substrate is not particularly limited, and various substrate materials can be used. In particular, a substrate material having a high visible light transmittance is preferably used. Furthermore, a material having a high barrier performance for blocking water and gas which penetrate from the outside of the element and is excellent in solvent resistance and weather resistance is preferred. Specifically, examples thereof include a transparent inorganic material such as quartz and glass; a transparent plastic such as polyethylene terephthalate, polyethylene naphthalate, polycarbonate, polystyrene, polyethylene, polypropylene, polyphenylene sulfide, polyvinylidene fluoride, acetylcellulose, brominated phenoxy, aramids, polyimides, polystyrenes, polyarylates, polysulfones and polyolefins.

The thickness of the transparent substrate is not particularly limited, and it can be appropriately selected in consideration of a light transmittance and a performance of blocking the inside and outside of the element.

Examples of the seal subject include an organic EL element, an organic EL display element, a liquid crystal display element, a solar cell element, and the like.

The method for producing the sealed body according to one embodiment of the invention is not particularly limited. For example, the adhesive layer of the sealing sheet according to one embodiment of the invention is laid on the seal subject and then heated to adhere the adhesive layer of the sealing sheet with the seal subject.

Subsequently, this adhesive layer is cured to produce the sealed body according to one embodiment of the invention.

An adhesion condition for adhering the adhesive layer of the sealing sheet and the seal subject is not particularly limited. The adhesion temperature is e.g. 23 to 100° C., and preferably 40 to 80° C. This adhesion treatment may be carried out with applying pressure.

As the curing condition for curing the adhesive layer, the above-described condition can be used.

The sealed body according to one embodiment of the invention is obtained by sealing the seal subject with the sealing sheet according to one embodiment of the invention.

Consequently, in the sealed body according to one embodiment of the invention, the performance of the seal subject is maintained for a long time.

EXAMPLES

Hereinafter, the present invention will be described in more detail with reference to Examples. Note that the present invention is not limited by the following Examples in any way.

The units "parts" and "%" in each Example respectively refer to "parts by mass" and "mass %" unless otherwise indicated.

Example 1

100 parts of modified polyolefin-based resin (α-olefin polymer, trade name: UNISTOLE H-200, manufactured by Mitsui Chemicals, Inc., weight average molecular weight: 52,000), 25 parts of polyfunctional epoxy compound (hydrogenated bisphenol A diglycidyl ether, trade name: Epolight 4000, manufactured by KYOEISHA CHEMICAL CO., LTD.) and 1 part of imidazole-based curing catalyst (trade name: Curezole 2E4MZ, manufactured by SHIKOKU CHEMICALS CORPORATION) were dissolved in methylethyl ketone to prepare a coating liquid having 18% of solid content.

This coating liquid was coated on a release-treated surface of a release film (trade name: SP-PET 382150, manufactured by Lintec Corporation), the resulting coated film was dried at 100° C. for 2 minutes to form an adhesive layer having a thickness of 25 µm, on which a release-treated surface of the other one release film (trade name: SP-PET 381031, manufactured by Lintec Corporation) was adhered to obtain a sealing sheet 1.

Example 2

A sealing sheet 2 was obtained in the same manner as Example 1 except that dimethylol tricyclodecane diglycidyl ether, trade name: ADEKA RESIN, EP-4088L, manufactured by ADEKA CORPORATION was used as the polyfunctional epoxy compound in Example 1.

Example 3

A sealing sheet 3 was obtained in the same manner as Example 1 except that BATG [2,2-bis(3-glycidyl-4-glycidyloxyphenyl)propane] trade name: SHOFREE, manufactured by SHOWA DENKO K.K. was used as the polyfunctional epoxy compound in Example 1.

Example 4

A sealing sheet 4 was obtained in the same manner as Example 1 except that hydrogenated bisphenol A diglycidyl ether (trade name: YX 8000, manufactured by Mitsubishi Chemical Corporation) was used as the polyfunctional epoxy compound in Example 1.

Example 5

A sealing sheet 5 was obtained in the same manner as Example 1 except that hydrogenated bisphenol A diglycidyl ether (trade name: YX 8034, manufactured by Mitsubishi Chemical Corporation) was used as the polyfunctional epoxy compound in Example 1.

Example 6

A sealing sheet 6 was obtained in the same manner as Example 4 except that a silane coupling agent (0.1 part of 3-glycidoxypropyltrimethoxysilane, trade name: KBM-403, manufactured by Shin-Etsu Chemical Co., Ltd.) was further contained in Example 4.

Example 7

A sealing sheet 7 was obtained in the same manner as Example 4 except that a silane coupling agent (0.1 part of 8-glycidoxyoctyltrimethoxysilane, trade name: KBM-4803, manufactured by Shin-Etsu Chemical Co., Ltd.) was further contained in Example 4.

Example 8

A sealing sheet 8 was obtained in the same manner as Example 5 except that a silane coupling agent (0.1 part of 3-glycidoxypropyltrimethoxysilane, trade name: KBM-403, manufactured by Shin-Etsu Chemical Co., Ltd.) was further contained in Example 5.

Example 9

A sealing sheet 9 was obtained in the same manner as Example 5 except that a silane coupling agent (0.1 part of 8-glycidoxyoctyltrimethoxysilane, trade name: KBM-4803, manufactured by Shin-Etsu Chemical Co., Ltd.) was further contained in Example 5.

Example 10

A sealing sheet 10 was obtained in the same manner as Example 1 except that a silane coupling agent (0.1 part of 8-glycidoxyoctyltrimethoxysilane, trade name: KBM-4803, manufactured by Shin-Etsu Chemical Co., Ltd.) was further contained in Example 1.

Comparative Example 1

A sealing sheet 11 was obtained in the same manner as Example 1, except that the polyfunctional epoxy compound or the imidazole-based curing catalyst was not used in Example 1.

Comparative Example 2

A sealing sheet 12 was obtained in the same manner as Example 1, except that the imidazole-based curing catalyst was not used in Example 1.

Comparative Example 3

A sealing sheet 13 was obtained in the same manner as Example 1, except that the modified polyolefin-based resin was changed to an acrylic polymer (trade name: OPTERIA MO-T015, manufactured by LINTEC Corporation,) in Example 1.

For the sealing sheets 1 to 13 obtained in Examples 1 to 10 and Comparative Examples 1 to 3, the following tests were carried out.

[Measurement of Peel Adhesion Strength]

One release film of the sealing sheet cut into a size of 25 mm×300 mm was peeled off, the exposed adhesive layer was laid on a polyethylene terephthalate sheet (trade name: COSMOSHINE PET 50A4300, manufactured by TOYOBO CO., LTD., thickness: 50 µm), and they were adhered to each other using a heat laminator at 40° C. Then, the other one release film was peeled off, the exposed adhesive layer was laid on a glass plate, and they were press-bonded to each other using the heat laminator at 40° C. Subsequently, this was heated at 100° C. for 2 hours to cure the adhesive layer, and then allowed to stand for 24 hours.

Using this as a test piece, peeling tests were carried out in a condition of a peeling angle of 180° in accordance with JIS Z0237: 2009 under an environment at 23° C. and a relative humidity of 50% and under an environment at 85° C. (humidity was not controlled) respectively to measure peel adhesion strengths (N/25 mm).

The measurement results are shown in Table 1 and Table 2.

[Evaluation Test of Organic EL Element]

Using a glass substrate on which an indium tin oxide (ITO) film (thickness: 100 nm, sheet resistance: 50 Ω/square) was formed as an anode, an organic EL element was prepared by the following method.

N,N'-bis(naphthalene-1-yl)-N,N'-bis(phenyl)-benzidine) (manufactured by Luminescence Technology Corp.) was vapor-deposited on the ITO film of the glass substrate at a rate of 0.1 to 0.2 nm/min to form a hole transport layer having a thickness of 50 nm, and subsequently tris(8-hydroxy-quinolinate) aluminum (manufactured by Luminescence Technology Corp.) was vapor-deposited on the hole transport layer at a rate of 0.1 to 0.2 nm/min to form a light-emitting layer having a thickness of 50 nm. Lithium fluoride (LiF) (manufactured by Kojundo Chemical Laboratory Co., Ltd.) was vapor-deposited on the light-emitting layer at a rate of 0.1 nm/min to form an electron injection layer having a thickness of 4 nm, and subsequently aluminum (Al) (manufactured by Kojundo Chemical Laboratory Co., Ltd.) was vapor-deposited on the electron injection layer at a rate of 0.1 nm/min to form a cathode having a thickness of 100 nm, so that an organic EL element was obtained. Note that all of degrees of vacuum during vapor deposition were $1 \times 10^{-4}$ Pa or lower.

One of the release films on the sealing sheets 1 to 13 obtained in Examples and Comparative Examples was peeled off, the exposed adhesive layer was laid on the metal foil film, and they were adhered to each other using a heat laminator at 40° C. Then, the other one release film was peeled off, the exposed adhesive layer was laid on the organic EL element formed on the glass substrate so as to cover the element, and they were adhered to each other using a heat laminator at 40° C. Subsequently, the adhesive layer was cured by heating it at 100° C. for 2 hours to obtain a bottom emission-type electronic device having the sealed organic EL element.

This electronic device was allowed to stand under an environment at 60° C. and a relative humidity of 90% for 250 hours, then the organic EL element was activated, the presence or absence of a dark spot (non-light emitting portion) was observed, and the sealing performance of the adhesive layer was evaluated in accordance with the following criteria.

Good: Dark spot accounts for less than 50% of the light emitting area
Bad: Dark spot accounts for 50% or more of the light emitting area Evaluation results are shown in Table 1 and Table 2.

TABLE 1

| | | Examples | | | Comparative Examples | | |
|---|---|---|---|---|---|---|---|
| | | 1 | 2 | 3 | 1 | 2 | 3 |
| Peel adhesion strength (N/25 mm) | 23° C., 50% relative humidity | 26.8 | 26.8 | 27.1 | 16.5 | 24.6 | 20.0 |
| | 85° C. | 12.8 | 12.6 | 13.5 | 8.2 | 2.5 | 1.8 |
| Evaluation test of organic EL element | | Good | Good | Good | Bad | Bad | Bad |

TABLE 2

| | | Examples | | | | | | |
|---|---|---|---|---|---|---|---|---|
| | | 4 | 5 | 6 | 7 | 8 | 9 | 10 |
| Peel adhesion strength (N/25 mm) | 23° C., 50% relative humidity | 28.2 | 27.6 | 26.1 | 28.9 | 27.2 | 28.3 | 27.5 |
| | 85° C. | 14.5 | 13.6 | 12.8 | 13.2 | 12.2 | 12.2 | 12.6 |
| Evaluation test of organic EL element | | Good | Good | Good | Good | Good | Good | Good |

The followings can be seen from Table 1 and Table 2.

The adhesive layers of the sealing sheets 1 to 10 in Examples 1 to 10 are excellent in adhesion strength at normal temperature and high temperature and also in sealing performance for the organic EL element.

On the other hand, the adhesive layers of the sealing sheets 11 to 13 in Comparative Examples 1 to 3 are poor in adhesion strength at normal temperature and high temperature and also in sealing performance for the organic EL element.

The invention claimed is:

1. An adhesive composition consisting of the following components (A), (B) and (C) and optionally one or more components selected from the group consisting of a solvent, a silane coupling agent, a UV absorber, an antistatic agent, a light stabilizer, an antioxidant, a resin stabilizer, a filler, a pigment, and a softener:
   Component (A): modified polyolefin-based resin,
   Component (B): polyfunctional epoxy compound selected from the group consisting of bisphenol A diglycidyl ether, bisphenol F diglycidyl ether, bisphenol S diglycidyl ether, brominated bisphenol A diglycidyl ether, brominated bisphenol F diglycidyl ether, brominated bisphenol S diglycidyl ether, novolak-type epoxy resin, hydrogenated bisphenol A diglycidyl ether, hydrogenated bisphenol F diglycidyl ether, hydrogenated bisphenol S diglycidyl ether, pentaerythritol polyglycidyl ether, 1,6-hexanediol diglycidyl ether, diglycidyl hexahydrophthalate, neopentylglycol diglycidyl ether, trimethylolpropane polyglycidyl ether, 2,2-bis(3-glycidyl-4-glycidyloxyphenyl) propane, and dimethylol tricyclodecane diglycidyl ether, and
   Component (C): imidazole-based curing catalyst,
   wherein a content of the component (B) is 25 to 110 parts by mass based on 100 parts by mass of the component (A).

2. The adhesive composition according to claim 1, wherein the component (A) is an acid-modified polyolefin-based resin.

3. The adhesive composition according to claim 1, wherein a content of the component (A) is 45 to 95 mass % based on a total solid content of the adhesive composition.

4. The adhesive composition according to claim 1, wherein a content of the component (C) is 0.1 to 10 parts by mass based on 100 parts by mass of the component (B).

5. The adhesive composition according to claim 1, which includes the silane coupling agent.

6. A sealing sheet composed of two release films and an adhesive layer sandwiched between the release films, wherein
   the adhesive layer is made by using the adhesive composition according to claim 1 and has thermosetting property.

7. A sealing sheet composed of a release film, a gas barrier film, and an adhesive layer sandwiched between the release film and the gas barrier film, wherein the adhesive layer is made by using the adhesive composition according to claim 1 and has thermosetting property.

8. The sealing sheet according to claim 7, wherein the gas barrier film is a metal foil, a resin film or a film glass.

9. A sealed body obtained by sealing a seal subject with the sealing sheet according to claim 6.

10. The sealed body according to claim 9, wherein the seal subject is an organic EL element, an organic EL display element, a liquid crystal display element or a solar cell element.

11. The adhesive composition according to claim 1, wherein the component (C) of the imidazole-based curing catalyst is selected from the group consisting of 2-methylimidazole, 2-phenylimidazole, 2-heptadecylimidazole, 2-ethyl-4-methylimidazole, 2-phenyl-4-methylimidazole, 2-phenyl-4-methyl-5-hydroxymethylimidazole, and 2-phenyl-4,5-dihydroxymethylimidazole.

12. An adhesive composition comprising the following components (A), (B) and (C) and optionally one or more components selected from the group consisting of a solvent, a silane coupling agent, a UV absorber, an antistatic agent, a light stabilizer, an antioxidant, a resin stabilizer, a filler, a pigment, and a softener:

Component (A): modified polyolefin-based resin,

Component (B): polyfunctional epoxy compound selected from the group consisting of bisphenol A diglycidyl ether, bisphenol F diglycidyl ether, bisphenol S diglycidyl ether, brominated bisphenol A diglycidyl ether, brominated bisphenol F diglycidyl ether, brominated bisphenol S diglycidyl ether, novolak-type epoxy resin, hydrogenated bisphenol A diglycidyl ether, hydrogenated bisphenol F diglycidyl ether, hydrogenated bisphenol S diglycidyl ether, pentaerythritol polyglycidyl ether, 1,6-hexanediol diglycidyl ether, diglycidyl hexahydrophthalate, neopentylglycol diglycidyl ether, trimethylolpropane polyglycidyl ether, 2,2-bis(3-glycidyl-4-glycidyloxyphenyl) propane, and dimethylol tricyclodecane diglycidyl ether, and Component (C): imidazole-based curing catalyst, wherein an extender is excluded, and wherein a content of the component (B) is 25 to 110 parts by mass based on 100 parts by mass of the component (A).

\* \* \* \* \*